United States Patent [19]

Loutfy et al.

[11] 4,175,981

[45] Nov. 27, 1979

[54] PHOTOVOLTAIC CELL COMPRISING METAL-FREE PHTHALOCYANINE

[75] Inventors: Rafik O. Loutfy; Lloyd F. McIntyre, both of Mississauga; James H. Sharp, Oakville, all of Canada

[73] Assignee: Xerox Corporation, Stamford, Conn.

[21] Appl. No.: 921,302

[22] Filed: Jul. 3, 1978

[51] Int. Cl.$^2$ .............................................. H01L 31/06
[52] U.S. Cl. ........................... 136/89 SJ; 136/89 NB; 250/211 J; 250/212; 357/8; 357/30; 357/15
[58] Field of Search ...................... 136/89 NB, 89 SJ; 250/211 J, 212, 211 R; 357/8, 30, 15

[56] References Cited

U.S. PATENT DOCUMENTS

| | | | |
|---|---|---|---|
| 3,009,981 | 11/1961 | Wildi et al. | 136/89 |
| 3,057,947 | 10/1962 | Calvin et al. | 136/89 |
| 3,530,007 | 9/1970 | Golubovic | 136/89 |
| 3,789,216 | 1/1974 | Komp | 250/211 R |
| 3,844,843 | 10/1974 | Kay et al. | 136/206 |

OTHER PUBLICATIONS

D. L. Morel et al., "High Efficiency Organic Solar Cells", *Appl. Phys. Lett.*, vol. 32, pp. 495-497 (1978).

G. A. Alferov et al., "Photoelectrochemical Behaviour of Phthalocyanines Under Galvanostatic Conditions", *Russian Jr. Phys. Chem.*, vol. 50, pp. 118-120 (1976).

A. K. Ghosh et al., "Photovoltaic & Rectification Properties of AlMg Phthalocyanine/Ag Schottky-Barrier Cells", *J. Appl. Phys.*, pp. 230-236 (1974).

M. I. Fedorov et al., "Photocells Based on Metal Phthalocyanines", *Soviet Physics Journal*, vol. 20, p. 695 (1977).

*Primary Examiner*—Aaron Weisstuch

[57] ABSTRACT

A photovoltaic cell wherein the photoactive layer comprises a thin layer of metal-free phthalocyanine dispersed in a binder. The electrical output is greatly in excess of that obtained from prior art organic semiconductor photovoltaic cells of the same surface area.

30 Claims, 7 Drawing Figures

PHOTOVOLTAIC CELL COMPRISING METAL-FREE PHTHALOCYANINE

BACKGROUND OF THE INVENTION

This invention relates to photovoltaic cells and more particularly to such cells containing an organic photoactive material. Even more particularly, this invention relates to photovoltaic cells wherein the semiconductor is an organic material comprising a dispersion of metal-free phthalocyanine in a binder.

Recently, photovoltaic cells have received much attention for several reasons. Earth satellites have become a common tool for such industries as communications which require electrical power at the remote location of use. While sufficient technology has been available to provide satellites with electrical energy directly from sunlight, typical photovoltaic cells utilized for the task have continued to be very expensive. Another recent motivation for research in the field of direct conversion of sunlight into electricity has been the realization that the conventional natural resources used for the production of electricity are finite. Thus, the search for an economical and ecologically acceptable means for producing electrical energy directly from sunlight has increased.

PRIOR ART STATEMENT

The current technology of photovoltaic devices largely employs silicon p-n cells which have a power conversion efficiency of up to about 15 percent. However, the silicon must be of controlled purity and in the form of a single crystal, thus causing the manufacturing cost to be extremely high. Research and development activity is also being carried on with inorganic compounds, such as GaAs, InP/CdS and $CdS/Cu_2S$ as photovoltaic device materials. The technology of device fabrication is complex and expensive even though power conversion efficiencies are relatively high (8 percent–17 percent).

Interest in the use of organic materials for practical photovoltaic devices has been minimal due to the very low power conversion efficiencies. For example, the most typical values are in the range of 0.01 percent–0.1 percent for various metal phthalocyanine systems, and of the order of 0.01 percent for chlorophyll systems. Apart from the low power conversion efficiencies, however, organic materials in the form of thin film polymer dispersions would offer extremely attractive economical advantages over inorganic devices.

Representative prior art efforts in the field of this invention are contained in the disclosure of the following U.S. Pat. Nos. 3,009,981, photoelectric cells employing millimeter-thick layers of polyphthalocyanines; 3,057,947, photoelectric cells employing millimeter-thick layer of phthalocyanine as one of two photoactive components; 3,789,216, externally biased photocells comprised of thin-film phthalocyanines, for sensing red laser emissions; 3,844,843, solar cells employing organic semiconductors dispersed in a gel; 3,530,007, discloses the use of other organic photosensitive materials in a photovoltaic cell and refers to phthalocyanine as having related properties though no suggestion is made to utilize phthalocyanine in a photovoltaic cell. Relatively high efficiency photovoltaic cells utilizing evaporated merocyanine dyes have been described by D. L. Morel and co-workers in Applied Physics Letters 32(8), pages 495–497 (1978).

Photoelectrochemical behavior of phthalocyanines, both metal and metal-free, was reported by G. A. Alferov and V. I. Sevast'yanov in the Russian Journal of Physical Chemistry, Vol. 50 (1), 1976, pages 118–120, in an article entitled, "Photoelectrochemical Behavior of Phthalocyanines Under Galvanostatic Conditions." A liquid electrolyte interface was utilized to determine photocurrent.

The use of a metal phthalocyanine in a photovoltaic cell is reported by Amal K. Ghosh, Don L. Morel, Tom Feng, Robert F. Shaw, and Charles A. Rowe, Jr. in Journal of Applied Physics, Vol. 45, No. 1, January 1974, in an article entitled, "Photovoltaic and Rectification Properties of Al/Mg Phthalocyanine/Ag Schottky Barrier Cells." Earlier work by Vartanian and Karpovich, and also by Tollin et al. is referred to as evidence that the photoconductivity action spectra of metal-free phthalocyanine are dependent on the thickness and direction of irradiation. More recently, M. J. Federov and co-workers have disclosed photocells based upon metal phthalocyanines in Sovient Physics Journal 20, page 695 (1977).

While organic photoactive materials have been previously utilized in photovoltaic cells, all have suffered the common deficiency of very low power conversion. That is, the amount of electrical current actually made available for use by the cell is small in comparison to the amount of solar energy impinging upon the cell. Metal phthalocyanines and polyphthalocyanines have been utilized in photovoltaic cells but with very poor power conversion efficiency. Thus, an efficient low-cost photovoltaic cell has not been previously available.

SUMMARY OF THE INVENTION

It is the principal object of this invention to provide a relatively efficient photovoltaic cell employing relatively inexpensive organic material as a primary photoactive ingredient.

Another object of this invention is to provide a photovoltaic cell which would yield improved power conversion efficiencies over prior art cells utilizing organic photoactive materials.

Another object of this invention is to provide an efficient photovoltaic cell which is easily and inexpensively fabricated.

The above objects are achieved by providing a photovoltaic cell comprising as a photoactive material a layer of metal-free phthalocyanine dispersed in a binder. When fabricated according to the following specification, the cell is capable of power conversion efficiencies far in excess of any previously known cell utilizing inexpensive organic photoactive materials. Although any of the various known forms of metal-free phthalocyanines can be employed, the x-form is preferred because it has exhibited higher conversion efficiency than the other forms.

BRIEF DESCRIPTION OF THE DRAWINGS

This invention will be more clearly understood from the following description of the specific embodiments read in conjunction with the accompanying drawings wherein.

DETAILED DESCRIPTION OF THE INVENTION

Figure 1:
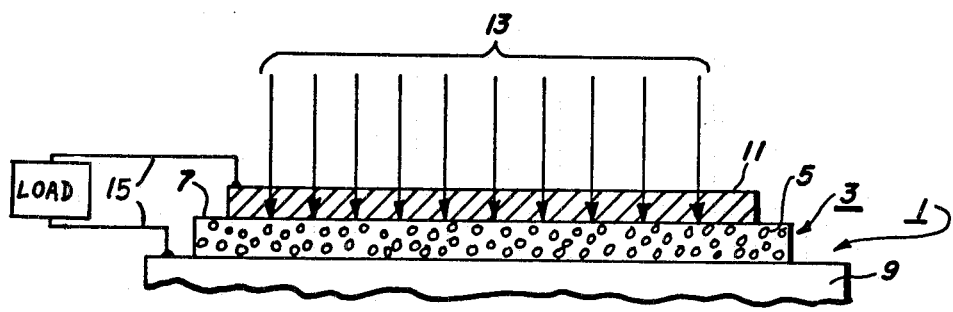
FIG. 1 is a side view in partial section of a photovoltaic cell of this invention.

In FIG. 1, there is shown cell 1 comprising a photoactive layer 3 containing a dispersion of metal-free phthalocyanine 5 in a binder 7. Photoactive layer 3 resides on electrode 9. Electrode 9 provides an ohmic contact with layer 3 and can be homogeneously electrically conductive or preferably is electrically insulating with a thin layer of conductive material at the interface with layer 3. A barrier electrode 11 is provided on layer 3 which is sufficiently transparent to permit light rays 13 to penetrate through to layer 3. Electrode 11 is typically very thin. FIG. 1 is shown in expanded view for clarity of description. Leads 15 provide connection of the cell to an electrical circuit utilizing the current produced by the cell upon solar irradiation.

The photovoltaic cell of this invention is easily fabricated by utilizing conventional equipment. To provide photoactive layer 3, the metal-free phthalocyanine of either alpha-, beta- or x-form is first dispersed in an electrically insulating binder. The amount of phthalocyanine in the photoactive layer can vary widely and any operable amount can be utilized. As will be more fully described below, typically the amount of metal-free phthalocyanine, by weight, can vary widely from an operable amount to 95 percent or more. Preferably, the amount of phthalocyanine in the binder is in the range of from about 55 percent to about 75 percent. The maximum observed efficiency has been found to be photoactive layers having from about 55 percent to about 65 percent, by weight, metal-free phthalocyanine.

The dispersion is then coated by conventional means onto electrode 9, thereby providing an ohmic contact with the photoactive material. Typical ohmic materials include gold, silver, platinum, copper and tin oxide. The dry thickness of photoactive layer 3 can vary widely and is typically in the range of from about 0.2 microns to about 200 microns in thickness, preferably from about 1 to about 3 microns. Any operable thickness can be employed but thicker layers waste material while extremely thin layers are difficult to manufacture uniformly. However, since light absorbance into the binder layer is extremely short, any thickness in excess of such absorbance depth is satisfactory.

Upon drying, the coating is provided with a second electrode 11 (a so-called Shottky barrier) by any suitable means. Typically, an extremely thin layer of appropriate metal is deposited onto layer 3 as by evaporating the metal and condensing it thereon. Each electrode is provided with contact means 15 which permits easy connection with an electrical circuit utilizing the electrical current.

While any suitable binder can be employed as binder 7, the most readily available and inexpensive binders are polymers and copolymers. Typical polymers include purified polyvinylcarbazole, polyvinylacetate, polycarbonate, for example, a product available under the tradename Lexan ® from General Electric Corporation, polystyrene, polystyrene acrylonitrile copolymer and polyacrylonitrile. Preferred binders are those providing the best dark insulating properties, as for example, polyvinyl acetate.

The photoactive layer of this invention can include a sensitizing agent to broaden or otherwise affect the absorption spectrum. A broadened spectral response enables greater light absorption. Typically, sensitizing agents are included in the photoactive layer 3 in the range of from an effective amount to about 20 percent, by weight. Typical sensitizers include Coumarine 6, Rhodamine 6G, Rubrene, perylene 9, 10-bis(phenylacetylene) anthracene and 1,4-diphenylisobenzofuran.

The extension of spectral response of metal-free phthalocyanine by means of dye sensitization is achieved by various methods. One method involves the diffusing of a dye into the precoated film of binder containing the phthalocyanine, for example, to a depth of 400 Angstroms. Another method is to evaporate a thin film of the sensitizing dye onto the top of the binder layer prior to placing the barrier electrode thereon. A preferred method is to prepare a solution of binder material and sensitizing dye in a common solvent. The metal-free phthalocyanine is then suspended in the solution, and the suspension coated onto an appropriate electrode.

Sensitizing dyes are selected so as to provide the optimum efficiency of the cell. Some criteria for selection aside from material cost and ease of fabrication is the effect on carrier generation which should not be lowered and the series resistance of the cell which must not be increased. Because of the coincidence of favorable properties, Coumarine 6, Rhodamine B, and Rhodamine 6G are preferred.

In one method of fabrication, a dispersion of phthalocyanine is prepared in a solution of the binder material in a volatile solvent. The suspension is ball milled so as to disperse the pigment. The polymorph is identified by its characteristic absorption spectrum having the pattern indicated in U.S. Pat. No. 3,932,180, or by J. H. Sharp and M. Lardon in Journal of Physical Chemistry, 72, 3230 (1968). The process of ball milling usually takes several hours. When the pigment is dispersed in binder solution, the suspension is coated by means of typical coating equipment onto a cleaned electrically conductive surface and dried thereon. One such coating means is a wire wound draw down rod. Other methods of coating are spin and dip coating. A doctor blade applicator can also be utilized to provide a uniform photoactive layer.

After suitable drying of the metal-free phthalocyanine binder layer, as by vacuum drying, a barrier electrode layer is placed onto the free surface of the photoactive layer 3. This step can be performed several ways. For example, by introducing an impurity of the correct type into the surface of the binder layer, a potential barrier can be created. That is, for a p-type photoactive material, an n-type impurity is introduced. A preferred method is to form a metal-semiconductor barrier by the deposition of a suitable transparent conductive film, such as by evaporation onto the layer to form the Shottky barrier. The desired thickness of electrode 11 is dependent on the light transmittance of the metal which is typically satisfactory in the range of from about 10 to about 20 percent. Obviously, thicker metallic layers decrease light transmission. Ideally, a completely transparent barrier electrode 11 is optimum. However, usable metals are those providing adequate barrier contact and electrical conduction while maintaining adequate light transmittance.

Any material having the proper Fermi level and light transmittance can be employed as the barrier electrode 11. The presently preferred material is aluminum because of its light transmittance and ease of handling in the evaporation method of deposition on layer 3. Of course, as with any photovoltaic cell of the prior art, the metal utilized in the barrier electrode must possess the proper electrical properties for a potential barrier which results in a space charge region or dipole region within the photoactive layer 3. Since metal-free phthalocyanine is a p-type semiconductor, the metal employed as a barrier electrode should have a low work function; optimally in the range of from about 3.8 to about 4.5 electron volts. Selection of appropriate metals to form the barrier electrode can thus be made easily. Other typically suitable metals include lead, chromium, titanium and zinc.

Figure 2:
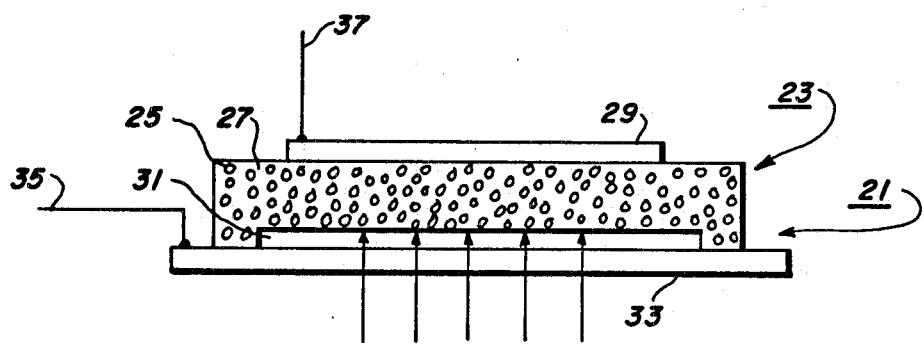
FIG. 2 is a side view in partial section of an alternative embodiment of the photovoltaic cell of this invention.

In an alternative embodiment, there is shown in FIG. 2 a photovoltaic cell of this invention wherein the barrier electrode is protected with a transparent protective coating. In FIG. 2, cell 21 comprises photoactive layer 23 comprising metal-free phthalocyanine particles 25 dispersed in binder 27. In both FIGS. 1 and 2, the drawings graphically depict the dispersion of particles 5 and 25 in binder 7 and 27 in an expanded view. In actual practice, particles 5 and 25 may be in contact with each other rather than separated by binder material as shown in FIGS. 1 and 2 for purposes of explanation.

Conductive electrode 29 provides an ohmic contact with photoactive layer 23 and an appropriate transparent barrier electrode 31 is placed on the opposite side of layer 23. As in FIG. 1, barrier electrode 31 is shown in greatly expanded view. Over electrode 31 is placed a transparent protective layer 33. Layer 33 provides protection for the extremely thin barrier electrode 31 and can be comprised of any electrically insulating highly transparent material. A preferred protective coating is a glass plate having coated thereon a thin layer of conductive metal oxide to come in contact with electrode 31 thereby conducting electricity therefrom outside the cell through lead 35. Lead 37 provides a means for attaching electrode 29 to an electrical circuit whereby the generated electrical current is utilized.

In another embodiment of this invention, the photovoltaic cell includes a thin insulating layer between the barrier electrode and the photoactive layer. Such an insulating layer increases the stability and lifetime of certain photovoltaic cells which may suffer degradation because of interaction between the barrier electrode and the photoactive material. Typical insulating layers include silicon mono- and dioxide. Any operable thickness is employed and normally such insulating layers are in the range of from about 5 to about 20 Angstrom units. An optimum thickness is in the range of from about 10 to about 20 Angstrom units. The insulating layer can conveniently be applied by evaporating the insulating material and condensing it onto the photoactive layer and then depositing the barrier layer onto the insulating layer.

PREFERRED EMBODIMENTS OF THE INVENTION

In the following examples, the photovoltaic cell device is fabricated by first dispersing a specified weight of x-form metal-free phthalocyanine pigment in 10 ml. of methylene chloride containing 0.15 grams polymer. The dispersion is then ball milled for 2 hours using 100 grams of ¼ inch stainless steel balls. The ball milled slurry is then coated on a pre-cleaned ohmic electrode comprising a glass plate having a transparent layer of tin oxide on its surface, commercially available under the tradename NESA ® from the Pittsburgh Plate Glass Company. A wire wound or draw bar is utilized to obtain a coating of the desired thickness. The coating is dried in vacuum at 25° C. for 24 hours. A semitransparent aluminum coating (10–50 percent transmittance) is vacuum vapor deposited onto the coating to form the barrier electrode. Contact between the metal electrode on the coated film and an external electrical lead is made with an indium contact away from the area utilized to absorb radiant energy. The purity of the aluminum metal is greater than 99.99 percent and the optical transmission of the evaporated film is measured using a calibrated light probe.

Unless otherwise noted, monochromatic light is utilized from a 150 watt Hanovia Xe lamp together with a Jarrel-Ash monochromator. Light intensities are measured by means of an Alphametric Radiometer, Model #1010, equipped with a Model P1100S calibrated light probe. The area of the photoactive film exposed to incident radiation is about 2 mm. by 5 mm. Unless otherwise noted, solar radiation is simulated utilizing a 500 watt xenon lamp in conjunction with a water filter. A power flux delivered by the system is 80 mWatts/cm². Electrical measurements are made with a Keithley 616 digital electrometer equipped with a Perkin Elmer Model 56 Chart Recorder. The dark and light current-voltage characteristics of the cells are determined.

In discussing the various photoelectric effects, the terms "open circuit" voltage, $V_{oc}$, and "short circuit" current, $J_{sc}$ are utilized where the external load resistance, R, is much greater or much less than the internal cell resistance, respectively.

The efficiency (n) of the cell is determined according to the following formula:

$$n = \frac{J_{sc} \cdot V_{oc}}{I \cdot T_M} \times ff \times 100$$

wherein $T_M$ is the fraction of light transmitted through the metal electrode, I is the incident light intensity in watts at a specified wavelength, $J_{sc}$ is the photocurrent passing through the external load at zero applied potential, and $V_{oc}$ is the potential developed across the cell at zero current flow. The term ff represents the fill factor which is 0.25 in the device of this invention.

EXAMPLES I–VI

Figure 3:
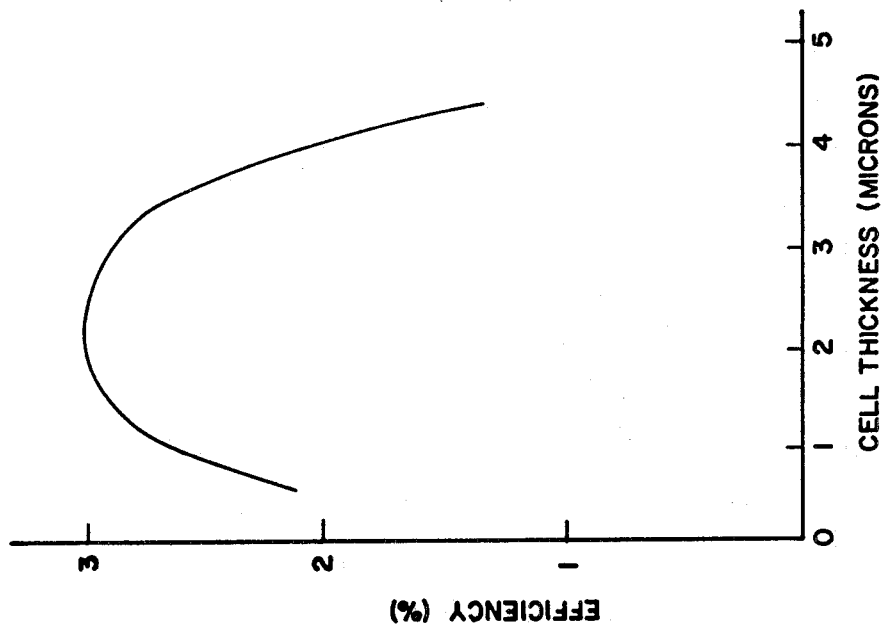
FIG. 3 is a graphical representation of the relationship between cell efficiency and x-form metal-free phthalocyanine concentration in the photoactive layer.

A series of six photovoltaic cells are constructed as described above with the concentration of the x-form metal-free phthalocyanine being respectively 15, 30, 45, 60, 75 and 90 percent, by weight, in a polyvinyl acetate binder. The photoactive binder layer is approximately 2.5 microns in thickness in each case and the aluminum barrier electrode has a light transmittance of approximately 17 percent. The cells are illuminated with 670 nm light and a constant incident light flux of approximately 0.1 mWatt/cm². The efficiency of the cell is computed in accordance with the above formula. The effect of x-form metal-free phthalocyanine concentration on the power conversion efficiency of the photovoltaic cells is shown in FIG. 3. The optimum concentration of pigment is found to be 60 percent, by weight.

EXAMPLES VII–XII

Figure 4:
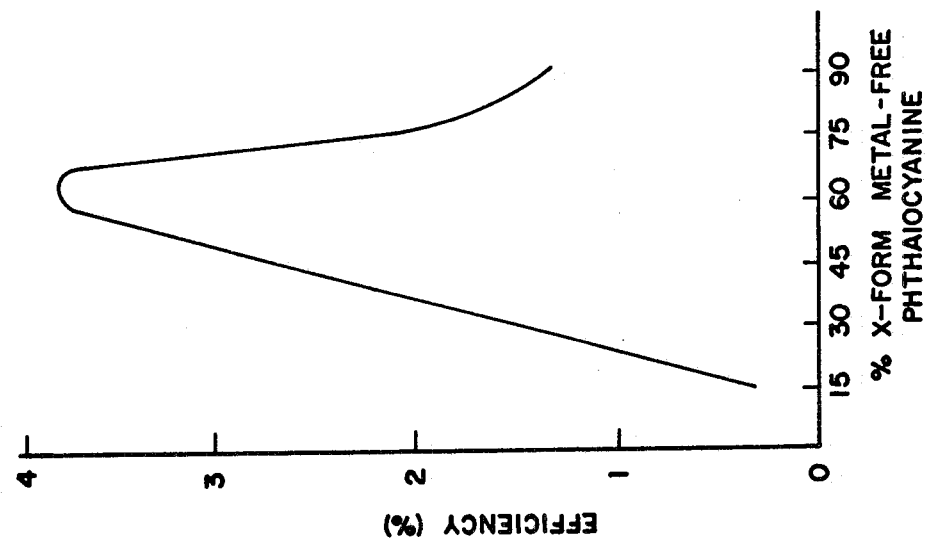
FIG. 4 is a graphical representation of the relationship between cell efficiency and thickness of the photoactive layer.

A series of photovoltaic cells are fabricated according to the above description with the exception that the thickness of the phthalocyanine photoactive layer is varied. In addition, the ohmic electrode incidently exhibits a slightly higher Fermi level than the ohmic electrode of Examples I–VI, which results in a slightly lower efficiency. All of the cells contain 60 percent, by weight, concentration of x-form metal-free phthalocyanine and when the slurry is coated onto the NESA ® electrode, the bar gap is varied so as to produce a range of layer thicknesses. The dry film thickness is determined by optical absorption at 870 nm and the corresponding values were found to be 4.5, 3.6, 2.7, 1.8, 0.9 and 0.5 microns, respectively. Each cell is illuminated utilizing 670 nm light and an incident light intensity of about 0.1 mWatt/cm². The data obtained is illustrated in FIG. 4 which shows the relationship between the cell thickness and computed power conversion efficiency. FIG. 4 indicates a maximum value is observed for a cell having a photoactive layer of 2.7 microns in thickness.

EXAMPLES XIII–XX

Figure 5:
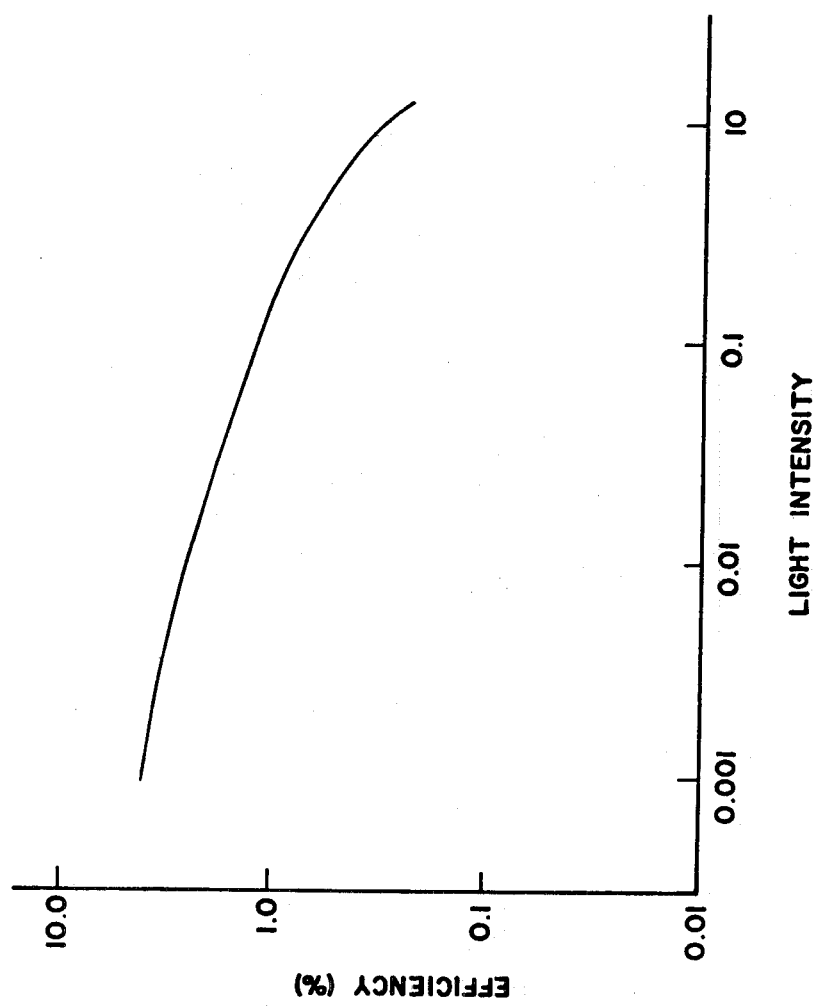
FIG. 5 is a graphical representation of the relationship between the cell efficiency and light intensity.

A series of photovoltaic cells are prepared as described above wherein the photoactive layers each contain 60 weight percent concentration x-form metal-free phthalocyanine and having a dry film thickness of 2.7 microns. In Examples XIII–XVI, the binder material is polyvinyl acetate while in Examples XVII–XX the binder material is poly(4,4'-isoproylidene diphenylene carbonate). The power conversion efficiency as a function of light intensity is measured utilizing a 632.8 nm He-Ne laser having an output power flux of 2.5 mWatts/cm². Light intensities are varied by inserting appropriate neutral density filters in front of the cells. The results appear in Table I below. The efficiency decreases with increasing light intensity, but even at high intensity the efficiency is greater than would be expected from organic photoactive material. The data is graphically displayed in FIG. 5.

TABLE I

| Example No. | Light Intensity I(mW/cm²) | Efficiency n |
|---|---|---|
| XIII | .9 | .14 |
| XIV | .089 | .53 |
| XV | .007 | 1.4 |
| XVI | .001 | 4.0 |
| XVII | 1.00 | .3 |
| XVIII | .1 | 1.2 |
| XIX | .01 | 2.5 |
| XX | .001 | 4.0 |

EXAMPLES XXI–XXVI

A series of photovoltaic cells are prepared as described above with a variety of different polymer binders. Each cell contains 60 percent by weight x-form metal-free phthalocyanine in the binder. All measurements are made at 670 nm at an absorbed light intensity of 0.017 mWatts/cm². The photoactive layer thickness is maintained at 2.7 microns in all cases and the light intensity is constant at 0.017 mWatts/cm². As can be seen from the results in Table II, the cell efficiency is not drastically altered by the polymer utilized in the binder for the x-form metal-free phthalocyanine. In Example XXI, a custom blended copolymer is utilized comprising a weight ratio of 65 percent polystyrene and 35 percent poly(n-butyl methacrylate). In Example XXIII, the binder was found to be less stable than the other polymers. The binder of Example XXV provided the greatest ease of fabrication while the binder of Example XXVI proved to be the most difficult to handle in preparing a uniform film of photoactive material.

TABLE II

| Example No. | Binder | Efficiency n |
|---|---|---|
| XXI | polystyrene-n butylmethacrylate | 2.5 |
| XXII | polystyrene | 2.0 |
| XXIII | polystyrene-acrylonitrile copolymer | 2.55 |
| XXIV | polyacrylonitrile | 2.21 |
| XXV | polyvinyl acetate | 2.79 |
| XXVI | polyvinyl carbazole | 2.9 |

EXAMPLE XXVII

Figure 7:
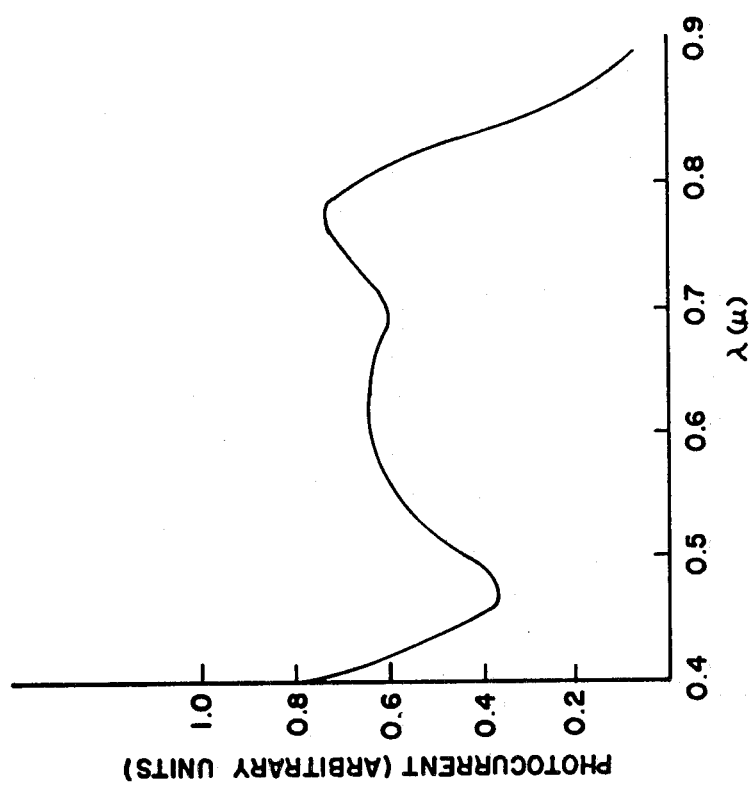
FIG. 7 is the light action spectrum of a dye sensitized cell of this invention.
Figure 6:
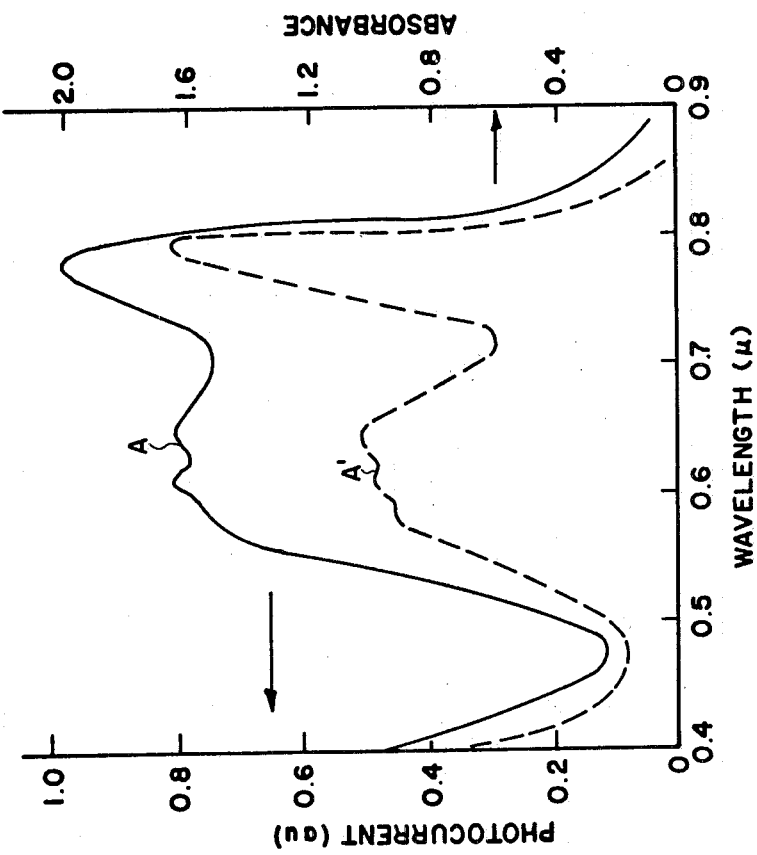
FIG. 6 is a light action spectrum of a typical photovoltaic cell of the invention.

A photovoltaic cell is prepared in accordance with the above-described procedure containing 60 percent x-form metal-free phthalocyanine in polyvinyl acetate. In addition to the photoactive pigment, a sensitizing dye Rhodamine B available from Makeson Coleman & Bell, Manufacturing Chemists, is added at a concentration of 14 percent, by weight. With a coating 2.7 microns thick, after drying, the absorbance and photocurrent production of the cell is measured over the light spectrum from 400 to 900 Angstroms. The data obtained is illustrated in FIG. 6 wherein curves A and A' represent the measured photocurrent and light absorbance, respectively, through the spectrum of the equivalent cell without sensitization. In FIG. 7, curve B illustrates the data obtained when the photocurrent is measured for the Rhodamine B sensitized cell. As can be seen in FIG. 7, the dye produces a broadened spectrum absorbance in the 500–650 nm region.

EXAMPLES XXVIII–XXX

Photovoltaic cells are prepared as described above with other metal-free phthalocyanines. In Example XXVIII, alpha metal-free phthalocyanine is utilized to prepare a cell wherein polyvinyl acetate is utilized as a binder. Sixty percent, by weight, of the pigment is suspended in a solution of the binder, and the suspension is coated onto the ohmic electrode to provide a dried layer 2.7 microns thick. In Example XXIX, beta metal-free phthalocyanine is utilized in place of the alpha phthalocyanine of Example XXVIII. In Example XXX, x-form metal-free phthalocyanine is utilized in a cell comparible with those of Examples XXVIII and XXIX. The power conversion efficiency of each cell is measured by the procedure described above utilizing light of 638.2 nm wavelength. The data obtained is contained in Table III below.

TABLE III

| | Percent Efficiency (n) | |
|---|---|---|
| Example No. | .1 mWatt/cm² | .5 mWatt/cm² |
| XXVIII | 1.13 | .4 |
| XXIX | .75 | .05 |

TABLE III-continued

| Example No. | Percent Efficiency (n) | |
|---|---|---|
| | .1 mWatt/cm$^2$ | .5 mWatt/cm$^2$ |
| XXX | 3.5 | 1.0 |

EXAMPLE XXXI

A photovoltaic cell is prepared as in Example IV with the exception that a thin layer of silicon dioxide is vapor deposited onto the phthalocyanine binder layer to a depth of 10 Angstrom units. The aluminum barrier electrode is then deposited onto the insulating layer. A stable photovoltaic cell is thus produced.

Other modifications can be made in the photovoltaic cell of this invention. Additives can be incorporated into the photoactive layer to stabilize or enhance the operating ability of the cell. Typical examples of stabilizer materials are tetrabutylammonium perchlorate and di-m-tolyl-diphenyl-biphenyldiamine. The operational stability of the cells of this invention are improved by dispersing such compounds in the photoactive binder layer at concentrations up to about 30 percent by weight of the photoactive layer. Higher concentrations can be employed, but efficiency of the cell may be lowered.

Another additive to the photoactive layer, for the purpose of increasing output efficiency, is electron acceptor materials. Such materials, when added to the photoactive layer, have been found to increase the efficiency of the cell calculated as described above. Typical electron acceptor materials include trinitrofluorenone, chloranil, ortho-benzoquinone, tetracyano-quindomethane and tetracyanoethylene. A preferred electron acceptor material is 2,4,7-trinitrofluorenone because it is the most efficient such additive observed to date.

EXAMPLES XXXII–XXVII

A series of photovoltaic cells are prepared having polyvinyl acetate binder and 60 percent by weight x-form metal-free phthalocyanine. The photoactive layer thickness is 2.7 microns. Increasing amounts of trinitrofluorenone are dispersed into the photoactive layer by dissolving the additive in the solvent together with the binder material at the time the photoactive material is dispersed in the binder. Each cell is then exposed to light at a wavelength of 670 nm. at an intensity of 50 microWatts/cm$^2$. The output efficiency, calculated as described above, is determined at various additive concentrations and set forth below in Table IV.

TABLE IV

| Example No. | Concentration wt. % | Efficiency n |
|---|---|---|
| XXXII | 0 | 1.75 |
| XXXIII | 1 | 2.15 |
| XXXIV | 2 | 3.5 |
| XXXV | 3.8 | 4.1 |
| XXXVI | 7.4 | 4.4 |
| XXXVII | 13.8 | 5.0 |

Although the invention has been described in terms of specified apparatus which is set forth in detail, it should be understood that this is by way of illustration only and that the invention is not necessarily limited thereto, since alternative embodiments and operating techniques will become apparent to those skilled in the art in view of the above disclosure.

What is claimed is:
1. A photovoltaic apparatus comprising a device having a first, ohmic electrode and a second, barrier electrode having sandwiched therebetween a photoactive layer comprising metal-free phthalocyanine dispersed in an electrically insulating binder and leads connecting each of said electrodes to an electrical circuit forming a load circuit wherein said device is the power source.
2. The apparatus of claim 1 wherein the layer has a thickness of from about 1 to about 3 microns.
3. The apparatus of claim 1 wherein the metal-free phthalocyanine is in the x-form.
4. The apparatus of claim 3 wherein the x-form metal-free phthalocyanine is present in the binder in the range of from about 15 to about 95 percent by weight.
5. The apparatus of claim 3 wherein the x-form metal-free phthalocyanine is present in the binder in the range of from about 55 to about 65 percent by weight.
6. The apparatus of claim 3 wherein the binder is a polymer selected from the group consisting of polystyrenes, polyacrylonitriles, polyvinylacetates, polycarbonates, copolymers of polystyrene and acrylonitrile, and polyvinylcarbazoles.
7. The apparatus of claim 1 wherein the barrier electrode comprises a vapor deposited layer of aluminum.
8. The apparatus of claim 1 wherein a light transparent protective layer resides on said barrier electrode.
9. The apparatus of claim 1 wherein said protective layer is dye sensitized.
10. The apparatus of claim 9 wherein the sensitizing dye commprises coumarine.
11. The apparatus of claim 1 wherein the metal-free phthalocyanine is in the alpha form.
12. The apparatus of claim 1 wherein the metal-free phthalocyanine is in the beta form.
13. The apparatus of claim 1 wherein an electrically insulating layer is provided between said photoactive layer and said barrier electrode.
14. The apparatus of claim 1 wherein the photoactive layer comprises a stabilizer.
15. The apparatus of claim 14 wherein the stabilizer is selected from the group consisting of tetrabutylammonium perchlorate and di-m-tolyl-diphenyl-biphenyldiamine.
16. The apparatus of claim 1 wherein the photoactive layer contains an electron acceptor material.
17. The apparatus of claim 16 wherein the electron acceptor material is selected from the group consisting of chloranil, ortho-benzoquinone, tetracyano-quindomethane, tetracyanoethylene and trinitrofluorenone.
18. A photovoltaic apparatus comprising a device having a first electrode having coated thereon a photoactive layer comprising from about 55 percent to about 65 percent, by weight, x-form metal-free phthalocyanine dispersed in an electrically insulating binder comprising polyvinyl acetate, a second, barrier electrode residing on said photoactive layer and leads connecting each of said electrodes to an electrical circuit forming a load circuit wherein said device is the power source.
19. The apparatus of claim 18 wherein said photoactive layer is dye sensitized.
20. The apparatus of claim 19 wherein said sensitizer is coumarine.
21. The apparatus of claim 19 wherein the dye is diffused into the photoactive layer to a depth of about 400 Angstroms at the barrier electrode interface.

22. The apparatus of claim 18 wherein said photoactive layer has a thickness of from about 1 to about 3 microns.

23. The apparatus of claim 18 wherein said barrier electrode is aluminum.

24. The method of converting light energy into electrical energy which comprises providing a device comprising a first, ohmic electrode and a second, barrier electrode and sandwiched therebetween a photoactive layer comprising metal-free phthalocyanine dispersed in an electrically insulating binder, and exposing said photoactive layer to light through said barrier electrode.

25. The method of claim 24 wherein the photoactive layer has a thickness of from about 1 to about 3 microns.

26. The method of claim 24 wherein the metal-free phthalocyanine is in the x-form.

27. The method of claim 26 wherein the x-form metal-free phthalocyanine is present in the binder in the range of from about 15 percent to about 95 percent, by weight.

28. The method of claim 26 wherein the x-form metal-free phthalocyanine is present in the binder in the range of from about 55 percent to about 65 percent, by weight.

29. The method of claim 24 wherein the binder is a polymer selected from the group consisting of polystyrenes, polyacrylonitriles, polyvinylacetates, polycarbonates, copolymers of polystyrene and acrylonitrile, and polyvinylcarbazoles.

30. The method of claim 24 wherein the barrier electrode comprises a vapor deposited layer of aluminum.

* * * * *

UNITED STATES PATENT AND TRADEMARK OFFICE
CERTIFICATE OF CORRECTION

PATENT NO. : 4,175,981
DATED : November 27, 1979
INVENTOR(S) : Rafik O. Loutfy et al.

It is certified that error appears in the above-identified patent and that said Letters Patent are hereby corrected as shown below:

In column 10, Claim 9, line 29, "protective" should be --photoactive--.

Signed and Sealed this

Tenth Day of June 1980

[SEAL]

Attest:

SIDNEY A. DIAMOND

Attesting Officer

Commissioner of Patents and Trademarks